United States Patent
Kimoto et al.

(10) Patent No.: US 10,602,647 B2
(45) Date of Patent: Mar. 24, 2020

(54) ELECTROMAGNETIC SHIELD COMPONENT AND WIRE HARNESS

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventors: Yuichi Kimoto, Yokkaichi (JP); Yasushi Itani, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 16/479,435

(22) PCT Filed: Jan. 10, 2018

(86) PCT No.: PCT/JP2018/000311
§ 371 (c)(1),
(2) Date: Jul. 19, 2019

(87) PCT Pub. No.: WO2018/135348
PCT Pub. Date: Jul. 26, 2018

(65) Prior Publication Data
US 2019/0387653 A1      Dec. 19, 2019

(30) Foreign Application Priority Data
Jan. 23, 2017  (JP) ................ 2017-009702

(51) Int. Cl.
| | | |
|---|---|---|
| H05K 9/00 | (2006.01) |
| H01B 7/00 | (2006.01) |
| H01R 4/02 | (2006.01) |
| H01R 13/6592 | (2011.01) |
| H02G 3/04 | (2006.01) |
| B60R 16/02 | (2006.01) |

(52) U.S. Cl.
CPC ......... *H05K 9/0098* (2013.01); *H01B 7/0045* (2013.01); *H01R 4/029* (2013.01);
(Continued)

(58) Field of Classification Search
CPC .................................................... H05K 9/0098
See application file for complete search history.

(56) References Cited

U.S. PATENT DOCUMENTS 5,287,074 A * 2/1994 Meguro ............... H03H 1/0007
                                                                      333/12
9,504,193 B2 * 11/2016 Sugino ................. H05K 9/0009
(Continued)

FOREIGN PATENT DOCUMENTS

| JP | S51-128655 A | 11/1976 |
| JP | S59-007493 A | 1/1984 |

(Continued)

OTHER PUBLICATIONS

Mar. 27, 2018 International Search Report issued in International Patent Application No. PCT/JP2018/000311.

*Primary Examiner* — Hung V Ngo
(74) *Attorney, Agent, or Firm* — Oliff PLC

(57) ABSTRACT

An electromagnetic shield component that includes a tube that is electrically conductive and has an internal space through which an electrical wire is to be inserted, wherein the tube includes: a first half-split tube that has a half-split tubular shape and has two first ends in a circumferential direction; a second half-split tube that has a half-split tubular shape and has two second ends in the circumferential direction that are provided so as to face the two first ends of (Continued)

the first half-split tube in the circumferential direction; and a plurality of connectors that contain a crystal refining agent, and are provided between, and are welded to, the two first ends of the first half-split tube in the circumferential direction and the two second ends of the second half-split tube in the circumferential direction.

8 Claims, 5 Drawing Sheets

(52) U.S. Cl.
CPC ....... *H01R 13/6592* (2013.01); *H02G 3/0481* (2013.01); *B60R 16/0215* (2013.01)

(56) References Cited

U.S. PATENT DOCUMENTS

| | | | | |
|---|---|---|---|---|
| 2005/0045357 | A1* | 3/2005 | Ichikawa | H02G 3/0431 174/50 |
| 2009/0120681 | A1* | 5/2009 | Matsuzaki | H01F 17/06 174/350 |
| 2010/0126752 | A1* | 5/2010 | Watanabe | H01B 7/426 174/102 D |
| 2013/0105215 | A1* | 5/2013 | Morris | H02G 3/0412 174/394 |
| 2013/0333936 | A1* | 12/2013 | Gundel | H01B 11/1895 174/350 |
| 2015/0334882 | A1* | 11/2015 | Sugino | B60R 16/0215 174/377 |
| 2016/0134096 | A1* | 5/2016 | Kett | H01R 31/02 174/360 |
| 2016/0199950 | A1 | 7/2016 | Bilhe et al. | |

FOREIGN PATENT DOCUMENTS

| | | |
|---|---|---|
| JP | S62-158505 A | 7/1987 |
| JP | H6-277857 A | 10/1994 |
| JP | 2007-280814 A | 10/2007 |
| JP | 2015-147237 A | 8/2015 |
| JP | 2015-185344 A | 10/2015 |
| JP | 2015-207751 A | 11/2015 |

* cited by examiner

ELECTROMAGNETIC SHIELD COMPONENT AND WIRE HARNESS

This application is the U.S. National Phase of PCT/JP2018/000311 filed Jan. 10, 2018, which claims priority to JP 2017-009702 filed Jan. 23, 2017, the entire disclosure of which is incorporated herein by reference.

BACKGROUND

The present disclosure relates to an electromagnetic shield component and a wire harness.

Conventionally, in some wire harnesses that are to be mounted on a vehicle, electrical wires are enclosed by an electromagnetic shield component, in order to address the issue of electromagnetic noise (for example, see JP2007-280814A).

The electromagnetic shield component includes an electrically-conductive tubular member and an electrically-conductive braided member, the ends of which are coupled to each other by a coupling member. The electromagnetic shield component performs electromagnetic shielding on electrical wires that are inserted into the series of tubes composed of the tubular member and the braided member.

SUMMARY

In an electromagnetic shield component as described above, electrical wires are subjected to electromagnetic shielding by being housed in an electrically-conductive tubular member. However, it is necessary to insert the electrical wires into the tubular member before attaching connectors to the ends of the electrical wires, for example.

Considering this fact, it can be possible to constitute the tubular member from a pair of half-split tubes and weld the half-split tubes to each other, and insert electrical wires into the tubular member after attaching connectors or the like to the ends of the electrical wires, for example. However, if two half-split tubes are simply welded to each other, crystal grains in the constituent material of the half-split tubes may be coarse as a result of welding, and there is the risk of the welded portion being likely to break.

An exemplary aspect of the disclosure provides an electromagnetic shield component and a wire harness with which it is possible to prevent crystal grains in the constituent material of a pair of half-split tubes from becoming coarse as a result of welding.

An electromagnetic shield component according to an exemplary aspect of the disclosure includes: a tube that is electrically conductive and has an internal space through which an electrical wire is to be inserted. The tube includes: a first half-split tube that has a half-split tubular shape and has two first ends in a circumferential direction; a second half-split tube that has a half-split tubular shape and has two second ends in the circumferential direction that are provided so as to face the two first ends of the first half-split tube in the circumferential direction; and a plurality of connectors that contain a crystal refining agent, and are provided between, and are welded to, the two first ends of the first half-split tube in the circumferential direction and the two second ends of the second half-split tube in the circumferential direction.

With this configuration, the plurality of connectors that contain a crystal refining agent are provided between the first half-split tube and the second half-split tube and are welded to the first half-split tube and the second half-split tube. Therefore, the crystal refining agent contained in the connection portions prevents crystal grains in the constituent material of the first and second half-split tubes from becoming coarse.

In the above-described electromagnetic shield component, it is preferable that each connector of the plurality of connectors includes: a main portion that contains the crystal refining agent; and a thermal effect portion that is located between a first end of the two first ends of the first half-split tube in the circumferential direction and a second end of the two second ends of the second half-split tube in the circumferential direction, and between the main portion and the first and second half-split tubes, to connect the first half-split tube and the second half-split tube.

With this configuration, the crystal refining agent contained in the main portions of the plurality if connectors prevents crystal grains in the thermal effect portions from becoming coarse.

In the above-described electromagnetic shield component, it is preferable that the two first ends of the first half-split tube in the circumferential direction and the two second ends of the second half-split tube in the circumferential direction are provided with recesses that house the main portions.

With this configuration, the two first ends of the first half-split tube in the circumferential direction and the two second ends of the second half-split tube in the circumferential direction are provided with recesses that house the main portions. Therefore, the first half-split tube and the second half-split tube are positioned relative to each other by the recesses when they are welded to each other using the plurality of connectors. Thus, it is possible to prevent the first half-split tube, the second half-split tube, and the plurality of connectors from being displaced from one another.

In the above-described electromagnetic shield component, it is preferable that the main portions are made of a material that has a melting temperature lower than a melting temperature of the first half-split tube and the second half-split tube.

With this configuration, the main portions are made of a material that has a melting temperature lower than the melting temperature of the first half-split tube and the second half-split tube. Therefore, when welding is performed, the main portions (the plurality of connectors) are preferentially melted. Thus, the shape of the first half-split tube and the shape of the second half-split tube can be maintained as much as possible.

A wire harness that solves the above-described problem includes one of the above-described electromagnetic shield components and an electrical wire that is inserted into the electromagnetic shield component.

With this configuration, it is possible to provide a wire harness that achieves the effect that is produced by the electromagnetic shield component.

With the electromagnetic shield component and the wire harness according to the present disclosure, it is possible to prevent crystal grains in the constituent material of a pair of half-split tubes from becoming coarse as a result of welding.

DETAILED DESCRIPTION OF EMBODIMENTS

The following describes an embodiment of a wire harness with reference to the drawings. Note that, in each drawing, for the sake of description, some of the components may be exaggerated or simplified. Also, the dimensional ratio of each part may differ from the actual ratio thereof.

Figure 1:
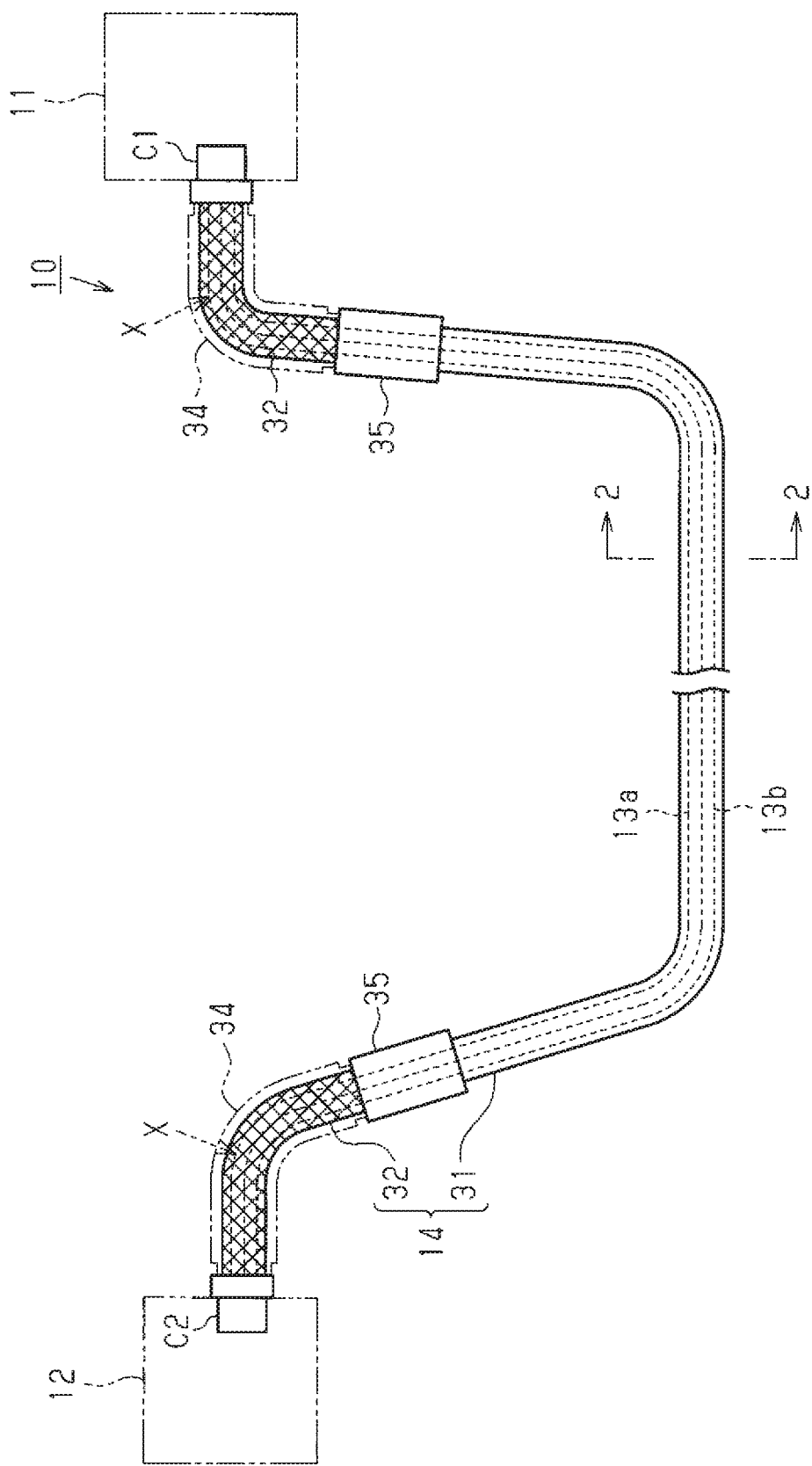
FIG. 1 shows an overall configuration of a wire harness according to an embodiment.

As shown in FIG. 1, a wire harness 10 according to the present embodiment is routed in a hybrid vehicle, an electric vehicle, or the like, under the floor or the like of the vehicle so as to connect a high-voltage battery 11 that is provided in a rear portion of the vehicle, and an inverter 12 that is provided in a front portion of the vehicle, to each other. The inverter 12 is connected to a wheel drive motor (not shown), which is a power source for the vehicle's travel. The inverter 12 generates AC power from DC power that is supplied from the high-voltage battery 11, and supplies the AC power to the motor. The high-voltage battery 11 is a battery that can supply a voltage of several hundred volts.

The wire harness 10 includes two high-voltage electrical wires 13a and 13b to which the positive terminal and the negative terminal of the high-voltage battery 11 are respectively connected, and an electromagnetic shielding component 14 that is tubular and encloses the high-voltage electrical wires 13a and 13b together.

Figure 2A:
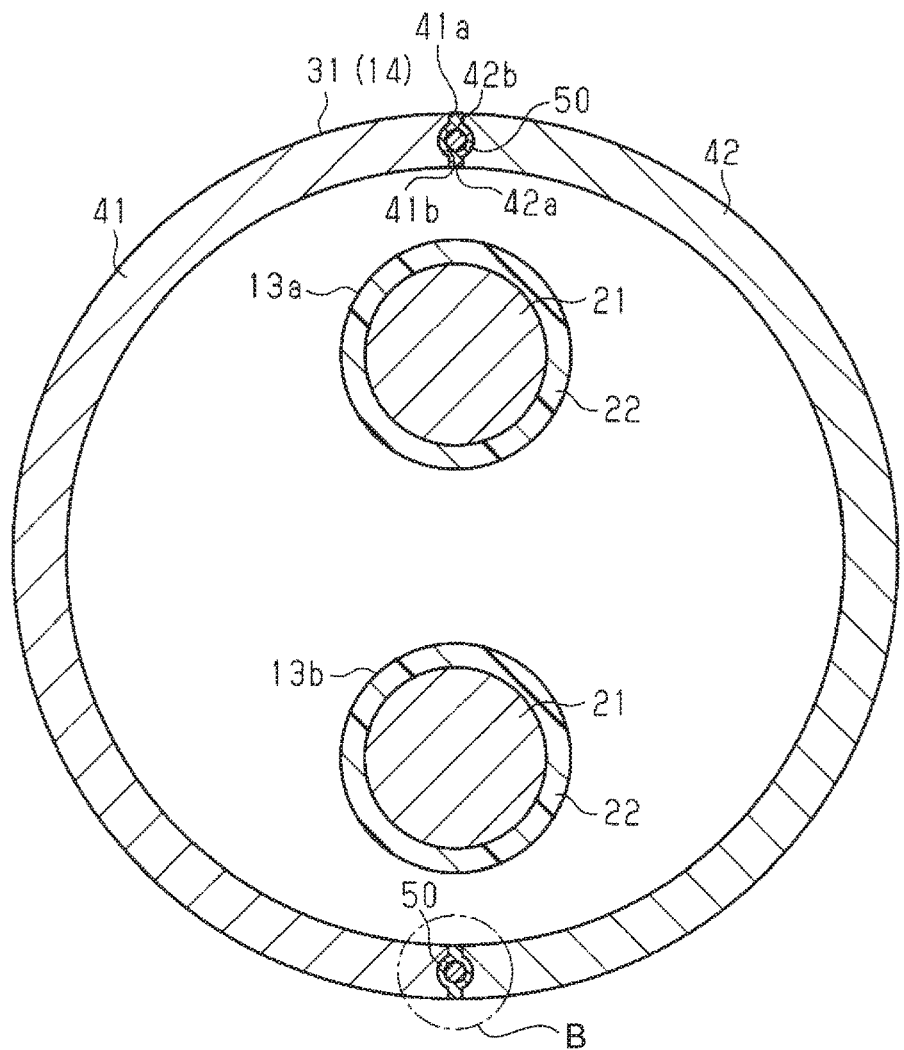
FIG. 2(a) is a cross-sectional view along line 2-2 in FIG. 1.
Figure 2B:
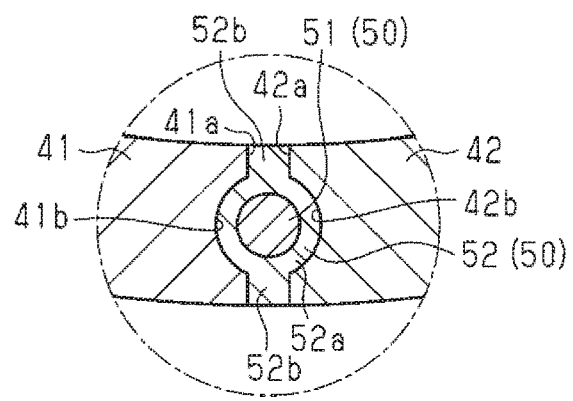
FIG. 2(b) is an enlarged view of FIG. 2(a).

As shown in FIGS. 2(a) and 2(b), each of the high-voltage electrical wires 13a and 13b is a coated electrical wire in which a core wire 21 that is made of a conductive material is coated with an insulation coating 22 that is made of a resin material. The insulation coating 22 is formed as an extrusion coating on the outer circumferential surface of the core wire 21, and coats the outer circumferential surface of the core wire 21 in an intimate contact state.

The high-voltage electrical wires 13a and 13b are non-shielded wires that do not have their own shield structures, and are electrical wires that can handle a high voltage and a large current. Each of the high-voltage electrical wires 13a and 13b is inserted into the electromagnetic shielding component 14. Also, one end of each of the high-voltage electrical wires 13a and 13b is connected to the high-voltage battery 11 via a connector C1, and the other end is connected to the inverter 12 via a connector C2.

The electromagnetic shielding component 14 has an elongated tubular shape overall. The electromagnetic shielding component 14 includes a metal pipe 31 that is located on an intermediate portion thereof in the lengthwise direction, and braided members 32 that are located in ranges other than the portion constituted by the metal pipe 31 and include both ends in the lengthwise direction.

The metal pipe 31 is made of an aluminum-containing metal material, for example. The metal pipe 31 is routed under the floor of the vehicle, and is bent so as to have a predetermined shape corresponding to the configuration of the area under the floor. The metal pipe 31 shields the high-voltage electrical wires 13a and 13b together, which are inserted thereinto, and protects the high-voltage electrical wires 13a and 13b from a stepping stone or the like. The metal pipe 31 may be referred to as a protection tube.

The metal pipe 31 according to the present embodiment includes a first half-split tube 41 that has the shape of a half-split tube, a second half-split tube 42 that has the shape of a half-split tube, and a connection portion 50 (connector) that connects the first half-split tube 41 and the second half-split tube 42 to each other.

The first half-split tube 41 is made of an aluminum-containing metal material, and recesses 41b that are recessed toward the center in the circumferential direction are respectively provided in end portions 41a of the first half-split tube 41 at both ends in the circumferential direction. The recesses 41b are respectively provided substantially at the centers of the end portions 41a in a radial direction thereof at both ends in the circumferential direction, and are each formed so as to span between one end to the other of the first half-split tube 41 in the lengthwise direction (a direction that is orthogonal to the sheet of drawing of FIG. 2).

The second half-split tube 42 has substantially the same configuration as the first half-split tube 41. The second half-split tube 42 is made of an aluminum-containing metal material, and recesses 42b that are recessed toward the center in the circumferential direction are respectively provided in end portions 42a of the second half-split tube 42 at both ends in the circumferential direction. The recesses 42b are respectively provided substantially at the centers of the end portions 42a in a radial direction thereof at both ends in the circumferential direction, and are each formed so as to span between one end to the other of the second half-split tube 42 in the lengthwise direction (a direction that is orthogonal to the sheet of drawing of FIG. 2). Therefore, when the end portions 41a of the first half-split tube 41 in the circumferential direction and the end portions 42a of the second half-split tube 42 in the circumferential direction are placed so as to face each other with the connection portions 50 being interposed therebetween, the recesses 41b and 42b at each end are located at substantially the same position in a radial direction.

Figure 3:
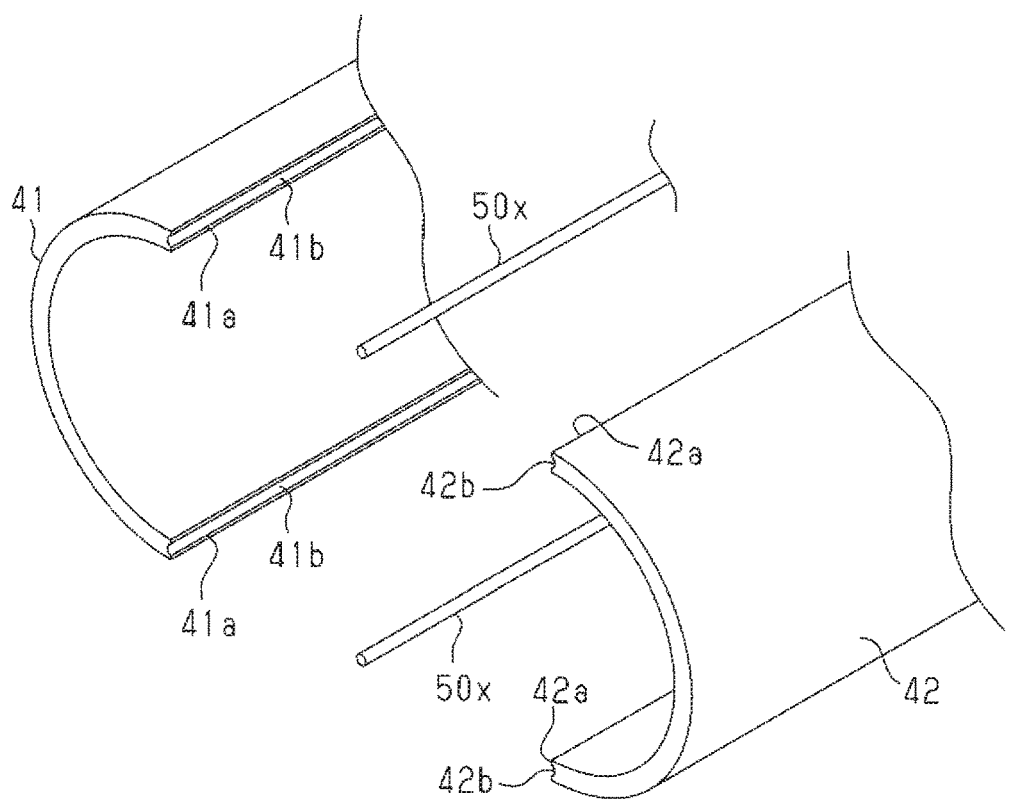
FIG. 3 is an exploded perspective view of a metal pipe before being subjected to welding.

Each connection portion 50 includes a main portion 51 that has a substantially cylindrical shape and is housed in space between a recess 41b of the first half-split tube 41 and a recess 42b of the second half-split tube 42, and a thermal effect portion 52 that covers the main portion 51 and is provided between the main portion 51 and the half-split tubes 41 and 42. The thermal effect portion 52 includes a cylindrical portion 52a and two extension portions 52b that extend outward in a radial direction, from positions outside the cylindrical portion 52a. Note that FIGS. 2(a) and 2(b) schematically show the connection portions 50 in a welded state. The connection portions 50 each have the shape of an elongated rod that extends in the lengthwise direction of the half-split tubes 41 and 42. FIG. 3 schematically shows the connection portions in an unwelded state. Hereinafter, the connection portions in a welded state are referred to as the connection portions 50, and the connection portions in an unwelded state are referred to as the unwelded connection portions 50x, unless otherwise specified. The unwelded connection portions 50x may also be referred to as welding support members.

The main portions 51 of the connection portions 50 are made of an aluminum-containing metal material that contains a crystal refining agent to which titanium is added. The aluminum-containing metal material used in the connection portions 50 has a lower melting temperature than the aluminum-containing metal material used in the first half-split tube 41 and the second half-split tube 42.

The main portions 51 and the cylindrical portions 52a of the thermal effect portions 52 are partially housed in the recesses 41b of the first half-split tube 41 and the recesses 42b of the second half-split tube 42.

The two extension portions 52b of each connection portion 50 are configured to extend outward in a radial direction of the cylindrical portion 52a from positions that are different from each other by approximately 180 degrees in the circumferential direction of the cylindrical portion 52a. Each extension portion 52b is provided between an end portion 41a of the first half-split tube 41 in the circumferential direction and an end portion 42a of the second half-split tube 42 in the circumferential direction.

The braided members 32 are tubular members (tubes) that are each formed by weaving a plurality of metal strands. The braided members 32 are coupled to the ends of the metal pipe 31 in the lengthwise direction thereof, using coupling members (not shown) such as crimp rings, and thus the braided members 32 and the metal pipe 31 are electrically continuous.

The outer circumference of each braided member 32 is enclosed by an exterior material 34 such as a corrugated tube. Grommets 35 that are made of rubber are attached to connection positions where the metal pipe 31 and the braided members 32 are connected, to cover the outer circumferences of the connection positions and prevent water from entering.

The braided members 32 enclose the outer circumferences of portions (outside-the-pipe portions X) of the high-voltage electrical wires 13a and 13b together, the portions being led out from the ends of the metal pipe 31. Thus, the outside-the-pipe portions X of the high-voltage electrical wires 13a and 13b are electromagnetically shielded by the braided members 32.

Next, a method for manufacturing the wire harness 10 (the metal pipe 31) according to the present embodiment will be described.

Figure 4:
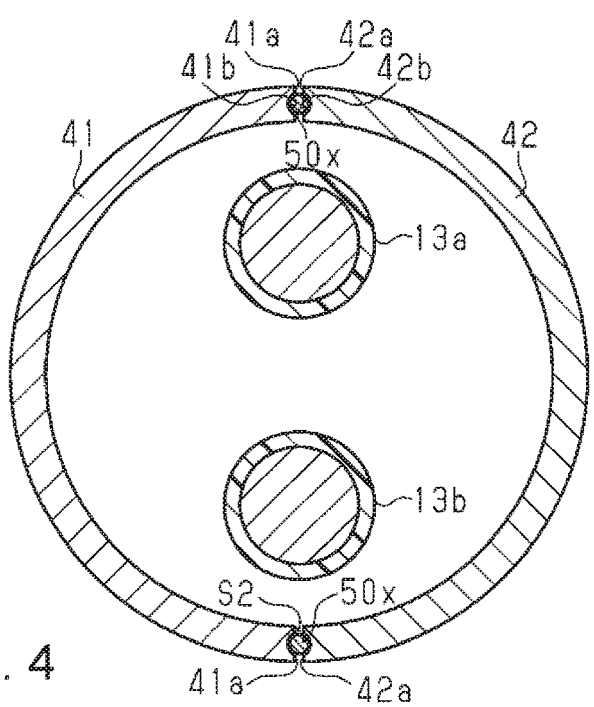
FIG. 4 is a cross-sectional view illustrating a method for manufacturing a wire harness.

As shown in FIG. 4, the unwelded connection portions 50x that have a substantially round rod shape are sandwiched between the recesses 41b of the end portions 41a of the first half-split tube 41 in the circumferential direction and the recesses 42b of the end portions 42a of the second half-split tube 42 in the circumferential direction. Note that, as shown in FIG. 4, according to the manufacturing method in this example, the unwelded connection portions 50x are sandwiched between the first half-split tube 41 and the second half-split tube 42 in a state where the high-voltage electrical wires 13a and 13b are housed therein. At this time, the unwelded connection portions 50x are fitted into the recesses 41b and the recesses 42b. Therefore, the first half-split tube 41 and the second half-split tube 42 are positioned by the unwelded connection portions 50x, and thus the first half-split tube 41 and the second half-split tube 42 are restricted from moving (being displaced) in a radial direction relative to each other.

Figure 5:
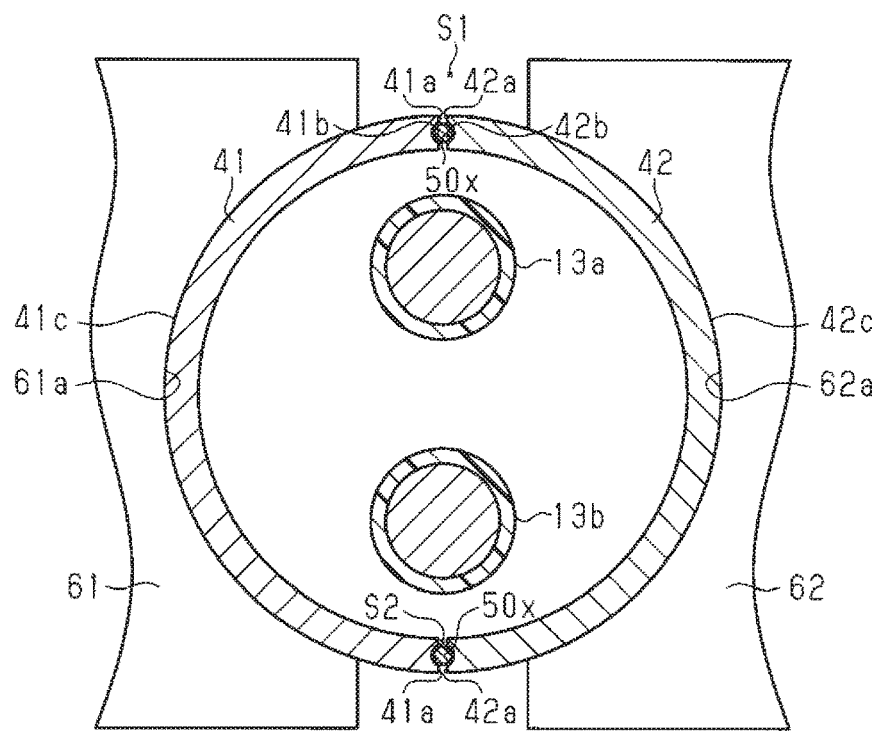
FIG. 5 is a cross-sectional view illustrating a method for manufacturing a wire harness.

As shown in FIG. 5, a state where the unwelded connection portions 50x are sandwiched between the first half-split tube 41 and the second half-split tube 42 is maintained using a first jig 61 and a second jig 62.

A sandwiching portion 61a of the first jig 61 and a sandwiching portion 62a of the second jig 62 respectively have curved surfaces that match arc-shaped outer circumferential surfaces 41c and 42c of the first half-split tube 41 and the second half-split tube 42. When the first half-split tube 41 and the second half-split tube 42 are held (sandwiched) by the first jig 61 and the second jig 62, the sandwiching portion 61a of the first jig 61 abuts against the outer circumferential surface 41c of the first half-split tube 41, and the sandwiching portion 62a of the second jig 62 abuts against the outer circumferential surface 42c of the second half-split tube 42. At this time, a gap S1 is provided between the first jig 61 and the second jig 62. Also, when the connection portions 50 are sandwiched between the first half-split tube 41 and the second half-split tube 42, gaps S2 are provided between the first half-split tube 41 and the second half-split tube 42.

Figure 6:
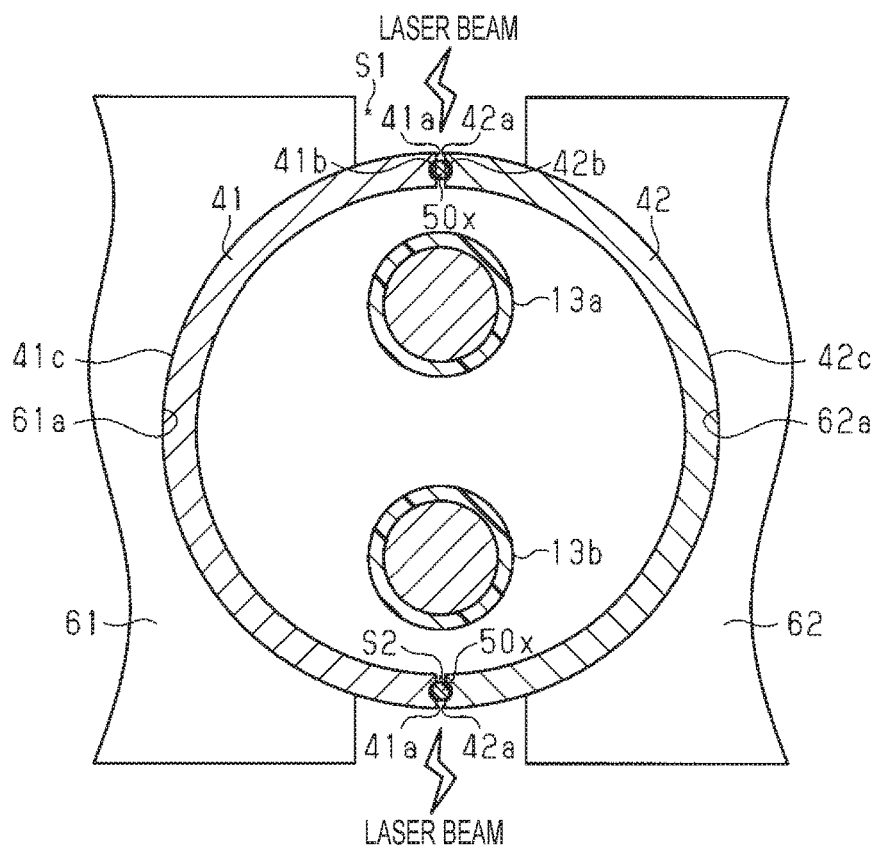
FIG. 6 is a cross-sectional view illustrating a method for manufacturing a wire harness.

As shown in FIG. 6, the unwelded connection portions 50x are irradiated with a laser beam through the gaps S1 and S2 and are melted. As a result of being melted by a laser beam, the unwelded connection portions 50x deform so as to fill the gaps S2 between the first half-split tube 41 and the second half-split tube 42, and thus the connection portions 50 as described above are formed. As a result, the first half-split tube 41 and the second half-split tube 42 are welded to each other using the connection portions 50, and thus the metal pipe 31 is complete.

Next, the action of the present embodiment will be described.

In the wire harness 10 according to the present embodiment, the connection portions 50 that contain a crystal refining agent are provided between the first half-split tube 41 and the second half-split tube 42 of the metal pipe 31. The component of the crystal refining agent in the connection portions 50 refines the crystal grains in the constituent material of the half-split tubes 41 and 42. Thus, the crystal grains in the constituent material of the half-split tubes 41 and 42 are prevented from becoming coarse. As a result, it is possible to prevent the connection portions from unexpectedly breaking or cracking. In contrast, if the crystal grains become coarse, the grains are likely to break at grain boundaries due to external force, and the tubular member is likely to break or crack.

Also, the main portions 51 included in the connection portions 50 have a lower melting temperature than the first half-split tube 41 and the second half-split tube 42, and therefore, when laser welding is performed, the connection portions 50 (the unwelded connection portions 50x) are preferentially melted. Thus, it is possible to maintain the shape of the first half-split tube 41 and the shape of the second half-split tube 42.

Next, the effect of the present embodiment will be described.

(1) The connection portions 50 that contain a crystal refining agent and are to be welded to the first half-split tube 41 and the second half-split tube 42 are provided between the first half-split tube 41 and the second half-split tube 42. Therefore, the crystal refining agent contained in the connection portions 50 (the main portions 51) prevents the crystal grains of the constituent material of the half-split tubes 41 and 42 from becoming coarse.

(2) The end portions 41a of the first half-split tube 41 in the circumferential direction and the end portions 42a of the second half-split tube 42 in the circumferential direction are provided with the recesses 41b and 42b that house the connection portions 50. Therefore, the first half-split tube 41 and the second half-split tube 42 are positioned relative to each other by the recesses 41b and 42b when they are welded to each other using the connection portions 50 (the unwelded connection portion 50x). Thus, it is possible to prevent the first half-split tube 41, the second half-split tube 42, and the connection portions 50 from being displaced from one another.

(3) The connection portions 50 are made of a material that has a melting temperature lower than the melting temperature of the material of the first half-split tube 41 and the second half-split tube 42. Therefore, when welding is performed, the connection portions 50 (the unwelded connection portions 50x) are preferentially melted. Thus, the shape of the first half-split tube 41 and the shape of the second half-split tube 42 can be maintained as much as possible.

Note that the above-described embodiment may be modified as follows.

In the above-described embodiment, the connection portions 50 (the main portions 51) are partially housed in the recesses 41b of the first half-split tube 41 and the recesses 42b of the second half-split tube 42. However, the present disclosure is not limited to such a configuration.

In the above-described embodiment, the recesses 41b of the first half-split tube 41 and the recesses 42b of the second half-split tube 42 are formed at the centers, in radial directions, of the end portions 41a and 42a of the half-split tubes 41 and 42 in the circumferential direction. However, the recesses 41b and the recesses 42b may be displaced outward in radial directions or displaced inward in radial directions. When the end portions 41a of the first half-split tube 41 in the circumferential direction and the end portions 42a of the second half-split tube 42 in the circumferential direction face each other, the recesses 41b and 42b of the half-split tubes 41 and 42 are located at the same position in a radial direction. However, they are not necessarily located at the same position.

In the above-described embodiment, when the connection portions 50 (the unwelded connection portions 50x) are held by the recesses 41b and 42b, the gaps S2 are provided on the outer side and the inner side in radial directions, between the end portions 41a of the first half-split tube 41 in the circumferential direction and the end portions 42a of the second half-split tube 42 in the circumferential direction. However, welding may be performed in a state where either one or both of the gaps S2 are omitted. In a case where the gaps S2 are omitted, the connection portions 50 in an unwelded state (the unwelded connection portions 50x) may fill the entire spaces between the end portions 41a of the first half-split tube 41 in the circumferential direction and the end portions 42a of the second half-split tube 42 in the circumferential direction.

In the above-described embodiment, the unwelded connection portions 50x, which are connection portions in an unwelded state, have a round rod shape. However, the unwelded connection portions 50x are not limited to having such a shape, and may have another shape such as a plate shape or a prismatic shape.

In the above-described embodiment, titanium is used as a crystal refining agent. However, the present disclosure is not limited in such a way. For example, it is possible to employ a configuration in which another material such as zirconium is used as a crystal refining agent.

In the above-described embodiment, laser welding is employed as a welding method. However, the present disclosure is not limited in such a way. For example, another welding method such as arc welding, gas welding, or electron beam welding may be employed.

In the wire harness 10 according to the above-described embodiment, the high-voltage electrical wires 13a and 13b are inserted into the electromagnetic shielding component 14. However, the configuration of the electrical wires that are inserted into the electromagnetic shielding component 14 may be changed as appropriate according to the configuration of the vehicle. For example, low-voltage electrical wires that connect a low-voltage battery and various low-voltage devices (such as a lamp and a car audio device) may be added as electrical wires that are inserted into the electromagnetic shielding component 14.

The positional relationship between the high-voltage battery 11 and the inverter 12 in the vehicle is not limited to that in the above-described embodiment, and may be changed as appropriate according to the configuration of the vehicle (the specifications of the vehicle). Also, although the high-voltage battery 11 is connected to the inverter 12 via the high-voltage electrical wires 13a and 13b in the above-described embodiment, the high-voltage battery 11 may be connected to a high-voltage device other than the inverter 12.

In the above-described embodiment, the present disclosure is applied to the wire harness 10 that connects the high-voltage battery 11 and the inverter 12 to each other. However, instead, the present disclosure may be applied to a wire harness that connects the inverter 12 and a vehicle drive motor.

Figure 7:
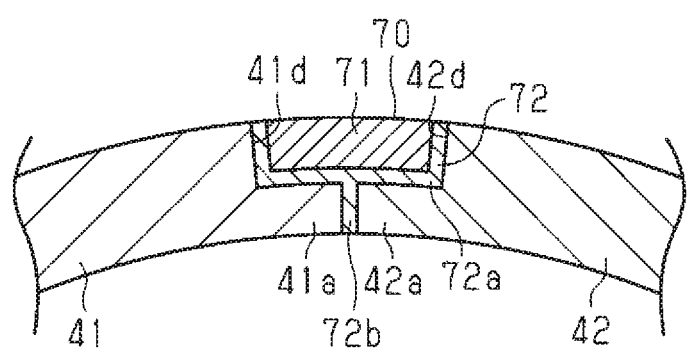
FIG. 7 is a cross-sectional view showing a portion of a metal pipe according to a modification.

In the above-described embodiment, the main portions 51 of the connection portions 50 are substantially located at the centers, in radial directions, of the end portions 41a and 42a at both ends of the first half-split tube 41 and the second half-split tube 42 in the circumferential direction. However, the present disclosure is not limited to such a configuration. As shown in FIG. 7, a main portion 71 of a connection portion 70 may be located outside in a radial direction. As shown in FIG. 7, the end portion 41a of the first half-split tube 41 in the circumferential direction has a cutout portion 41d, which is an outer portion in a radial direction. Also, the end portion 42a of the second half-split tube 42 in the circumferential direction has a cutout portion 42d, which is an outer portion in a radial direction. The main portion 71 of the connection portion 70 is provided so as to span between the cutout portions 41d and 42d. The connection portion 70 includes a thermal effect portion 72 that is located between the main portion 71 of the connection portion 70 and the end portions 41a and 42a of the half-split tubes 41 and 42. The thermal effect portion 72 includes a covering portion 72a that covers an end surface of the main portion 71 in the circumferential direction and an inner surface of the main portion 71 in a radial direction, and an extension portion 72b that extends inward in a radial direction form the inner surface of the covering portion 72a in a radial direction. The extension portion 72b is provided between the end portions 41a and 42a so as to connect the end portions 41a and 42a of the half-split tubes 41 and 42, which are not provided with the cutout portions 41d and 42d.

The above-described embodiment and modifications may be combined as appropriate.

The present disclosure includes the following configurations. The reference signs of the constituent elements of the embodiment are provided in order to facilitate understanding of the present disclosure, but there is no intention to limit the present disclosure.

Supplementary Note 1: An electromagnetic shield component (14) that includes a protection tube (31) for protecting one or more electrical wires (13a, 13b), comprising:

a first half-split tube (41) that has first coupling end surfaces (41a) and is made of a first material;

a second half-split tube (42) that has second coupling end surfaces (42a) and is made of the first material; and welding portions (50) that are welded to the first coupling end surfaces (41a) and the second coupling end surfaces (42a) so as to form the protection tube (31), wherein the welding portions (50) are formed by sandwiching welding assist members (50x) that have compositions that contain a second material and a crystal refining agent (Ti, Zr) between the first coupling end surfaces (41a) and the second coupling end surfaces (42a), and welding the first coupling end surfaces (41a) and the second coupling end surfaces (42a) to each other in a state where the welding assist members (50x) are in contact with the first coupling end surfaces (41a) and the second coupling end surfaces (42a).

Supplementary Note 2: The electromagnetic shield component (14) according to Supplementary Note 1, wherein the first half-split tube (41) and the second half-split tube (42) are welded to each other to be formed as a single piece, and functions as the protection tube (31) that partitions an internal space through which the one or more electrical wires (13a, 13b) are to be inserted.

Supplementary Note 3: the electromagnetic shield component (14) according to Supplementary Note 1 or 2, wherein the first material includes metal aluminum or an aluminum alloy.

Supplementary Note 4: The electromagnetic shield component (14) according to any one of Supplementary Notes 1 to 3, wherein the melting temperature of the second material is lower than the melting temperature of the first material.

Supplementary Note 5: The electromagnetic shield component (14) according to any one of Supplementary Notes 1 to 4, wherein the crystal refining agent is a metal that is different from aluminum.

Supplementary Note 6: The electromagnetic shield component (14) according to any one of Supplementary Notes 1 to 4, wherein the crystal refining agent is titanium or zirconium.

Supplementary Note 7: The electromagnetic shield component (14) according to any one of Supplementary Notes 1 to 6, wherein the first coupling end surfaces (41a) and the second coupling end surfaces (42a) are substantially parallel with the central axis of the protection tube (31).

Supplementary Note 8: The electromagnetic shield component (14) according to any one of Supplementary Notes 1 to 7, wherein one or both of: the first coupling end surfaces (41a); and the second coupling end surfaces (42a) include positioning recesses (41b; 42b) that at least partially house the welding assist members (50x).

Supplementary Note 9: The electromagnetic shield component (14) according to Supplementary Note 8, wherein the positioning recesses (41b; 42b) of the first coupling end surfaces (41a) and the second coupling end surfaces (42a) are grooves that extend along the entire lengths of the first coupling end surfaces (41a) and the second coupling end surfaces (42a).

Supplementary Note 10: The electromagnetic shield component (14) according to any one of Supplementary Notes 1 to 9, wherein the welding assist members (50x) are elongated members.

Supplementary Note 11: The electromagnetic shield component (14) according to any one of Supplementary Notes 1 to 10, wherein the first coupling end surfaces (41a) and the second coupling end surfaces (42a) have a first length when measured along the central axis of the protection tube (31).

Supplementary Note 12: A method for manufacturing an electromagnetic shield component (14) that includes a protection tube (31) for protecting one or more electrical wires (13a, 13b), the method comprising:

forming a first half-split tube (41) that has first coupling end surfaces (41a), from a first material;

forming a second half-split tube (42) that has second coupling end surfaces (42a), from the first material;

forming the protection tube (31) by welding the first coupling end surfaces (41a) and the second coupling end surfaces (42a) to each other;

wherein the welding includes sandwiching welding assist members (50x) that have compositions that contain a second material and a crystal refining agent (Ti, Zr) between the first coupling end surfaces (41a) and the second coupling end surfaces (42a), and welding the first coupling end surfaces (41a) and the second coupling end surfaces (42a) to each other in a state where the welding assist members (50x) are in contact with the first coupling end surfaces (41a) and the second coupling end surfaces (42a).

It will be apparent to those skilled in the art that the present disclosure may be embodied in other specific forms without departing from the technical concept of the present disclosure. For example, some of the components described in the embodiment (or one or more aspects thereof) may be omitted, or some components may be combined with each other.

The invention claimed is:

1. An electromagnetic shield component comprising:
a tube that is electrically conductive and has an internal space through which an electrical wire is to be inserted, wherein the tube includes:
a first half-split tube that has a half-split tubular shape and has two first ends in a circumferential direction;
a second half-split tube that has a half-split tubular shape and has two second ends in the circumferential direction that are provided so as to face the two first ends of the first half-split tube in the circumferential direction; and
a plurality of connectors that contain a crystal refining agent, and are provided between, and are welded to, the two first ends of the first half-split tube in the circumferential direction and the two second ends of the second half-split tube in the circumferential direction.

2. The electromagnetic shield component according to claim 1,
wherein each connector of the plurality of connectors includes:
a main portion that contains the crystal refining agent; and
a thermal effect portion that is located between a first end of the two first ends of the first half-split tube in the circumferential direction and a second end of the two second ends of the second half-split tube in the circumferential direction, and between the main portion and the first and second half-split tubes, to connect the first half-split tube and the second half-split tube.

3. The electromagnetic shield component according to claim 2,
wherein the two first ends of the first half-split tube in the circumferential direction and the two second ends of the second half-split tube in the circumferential direction are provided with recesses that house the main portions.

4. The electromagnetic shield component according to claim 2,
wherein the main portions are made of a material that has a melting temperature lower than a melting temperature of the first half-split tube and the second half-split tube.

5. The electromagnetic shield component according to claim 1,
wherein the two first ends in the circumferential direction respectively include first recesses,
the two second ends in the circumferential direction respectively include second recesses that face the first recesses, and the plurality of connectors are sandwiched between the first recesses and the second recesses, and fill gaps between the first recesses and the second recesses.

6. The electromagnetic shield component according to claim 5,
wherein the first recesses are dents that are formed so as to span between one end to the other of the first half-split tube in a lengthwise direction thereof, and the second recesses are dents that are formed so as to span between one end to the other of the second half-split tube in a lengthwise direction thereof.

7. The electromagnetic shield component according to claim 5,
wherein the two first ends in the circumferential direction respectively include first non-recessed end surfaces excluding the first recesses,
the two second ends in the circumferential direction respectively include second non-recessed end surfaces excluding the second recesses and facing the first non-recessed end surfaces, and
the connection portions fill gaps between the first recesses and the second recesses, and gaps between the first non-recessed end surfaces and the second non-recessed end surfaces.

8. A wire harness comprising:
the electromagnetic shield component according to claim 1; and
the electrical wire that is inserted through the internal space of the tube of the electromagnetic shield component.

* * * * *